(12) United States Patent
Jiang

(10) Patent No.: US 11,232,981 B2
(45) Date of Patent: Jan. 25, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Li Jiang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/940,730

(22) Filed: Jul. 28, 2020

(65) Prior Publication Data
US 2021/0035858 A1  Feb. 4, 2021

(30) Foreign Application Priority Data

Jul. 31, 2019 (CN) .......................... 201910698154.5

(51) Int. Cl.
*H01L 21/768* (2006.01)
*H01L 29/66* (2006.01)
*H01L 29/78* (2006.01)

(52) U.S. Cl.
CPC .. *H01L 21/76841* (2013.01); *H01L 21/76802* (2013.01); *H01L 21/76877* (2013.01); *H01L 29/66477* (2013.01); *H01L 29/78* (2013.01)

(58) Field of Classification Search
CPC ......... H01L 21/76841; H01L 21/76843; H01L 21/76849; H01L 21/76834; H01L 21/76877; H01L 21/76846
See application file for complete search history.

(56) References Cited

U.S. PATENT DOCUMENTS

| | | | |
|---|---|---|---|
| 9,287,213 B2* | 3/2016 | Zhang | H01L 21/76849 |
| 10,388,563 B2* | 8/2019 | Kim | H01L 23/53295 |
| 2009/0289370 A1* | 11/2009 | Besser | H01L 23/53209 257/768 |
| 2015/0061024 A1* | 3/2015 | Li | H01L 29/0847 257/368 |
| 2020/0343135 A1* | 10/2020 | Huang | H01L 21/76825 |
| 2021/0091191 A1* | 3/2021 | Ho | H01L 29/41775 |

* cited by examiner

*Primary Examiner* — Zandra V Smith
*Assistant Examiner* — John M Parker
(74) *Attorney, Agent, or Firm* — Anova Law Group, PLLC

(57) ABSTRACT

A method for forming a semiconductor device includes forming a gate structure on a substrate, and a doped source/drain region on each side of the gate structure; forming a first interlayer dielectric layer, the top surface of the first interlayer dielectric layer leveled with the top surface of the gate structure; forming a contact hole in the first interlayer dielectric layer on each side of the gate structure; forming a cobalt layer in the contact hole, the top surface of the cobalt layer lower than the top surface of the first interlayer dielectric layer; forming a protective layer to cover the cobalt layer, the top layer of the protective layer lower than the top surface of the first interlayer dielectric layer; and forming a second interlayer dielectric layer, the top surface of the second interlayer dielectric layer leveled with the top surface of the first interlayer dielectric layer.

15 Claims, 6 Drawing Sheets

SEMICONDUCTOR DEVICE AND FABRICATION METHOD THEREOF

CROSS-REFERENCES TO RELATED APPLICATIONS

This application claims the priority of Chinese Patent Application No. CN201910698154.5, filed on Jul. 31, 2019, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

In semiconductor devices, reducing resistance capacitance (RC) delay can improve the performance of the semiconductor devices. As the technology node of semiconductor process advances, the integration of devices becomes higher and higher, and the critical dimension of devices also becomes smaller and smaller. Accordingly, further reducing the RC delay has become an important measure to improve the performance of semiconductor devices.

As the dimensions of semiconductor devices continue to decrease, the critical dimensions of metal contacts and interconnect structures in devices are also getting smaller and smaller. At present, in order to reduce the RC delay, contact-hole plugs is usually made of a material with a small resistance value, such as cobalt or tungsten, etc. and that the performance of the semiconductor device may be improved.

However, even when a material with a small resistance value is selected for forming the contact-hole plugs, the performance of semiconductor structures may still need to be improved. The disclosed semiconductor structures and fabrication methods thereof are directed to solve one or more problems set forth above and other problems in the art.

BRIEF SUMMARY OF THE DISCLOSURE

One aspect of the present disclosure provides a method for forming a semiconductor device. The method includes forming a gate structure on a substrate, and forming a doped source/drain region in the substrate and on each side of the gate structure; forming a first interlayer dielectric layer, the top surface of the first interlayer dielectric layer leveled with the top surface of the gate structure; forming a contact hole in the first interlayer dielectric layer on each side of the gate structure to expose the doped source/drain region and the substrate in the doped source/drain region; forming a cobalt layer in the contact hole, the top surface of the cobalt layer lower than the top surface of the first interlayer dielectric layer; forming a protective layer to cover the cobalt layer, the top layer of the protective layer lower than the top surface of the first interlayer dielectric layer; and forming a second interlayer dielectric layer on the protective layer, a top surface of the second interlayer dielectric layer leveled with the top surface of the first interlayer dielectric layer.

Another aspect of the present disclosure provides a semiconductor device. The semiconductor device includes a substrate; a gate structure formed on the substrate; a doped source/drain region formed in the substrate on each side of the gate structure; a first interlayer dielectric layer, formed on the substrate and having a top surface leveled with the top surface of the gate structure; and a cobalt layer, formed in the first interlayer dielectric layer and having a top surface lower than the top surface of the first interlayer dielectric layer. The cobalt layer is connected to the substrate. The semiconductor device further includes a protective layer, covering the cobalt layer and having a top surface lower than the top surface of the first interlayer dielectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In order to reduce the RC delay in semiconductor devices, a material with a small resistance value is usually adopted to form contact-hole plugs. However, the performance of the semiconductor devices may still need to be further improved.

For example, according to current semiconductor manufacturing technology, because of the small resistance and the desired gap filling property, cobalt is usually used for forming the contact-hole plugs so as to reduce the RC delay in the semiconductor device. However, when cobalt is used as the interconnect material, the corrosion of cobalt may become a problem. For example, when a layer of tungsten is deposited on cobalt as a connection material between metal layers, the $WF_4$ gas used during the deposition of tungsten may easily cause corrosion of cobalt.

The present disclosure provides a method for forming semiconductor devices. According to the disclosed method, after filling a cobalt layer into a contact hole, a protective layer is formed on the cobalt layer. The protective layer covers the cobalt layer, thereby preventing the $WF_4$ gas from causing corrosion of cobalt during the subsequent deposition of a tungsten layer on the cobalt layer.

Figure 13:
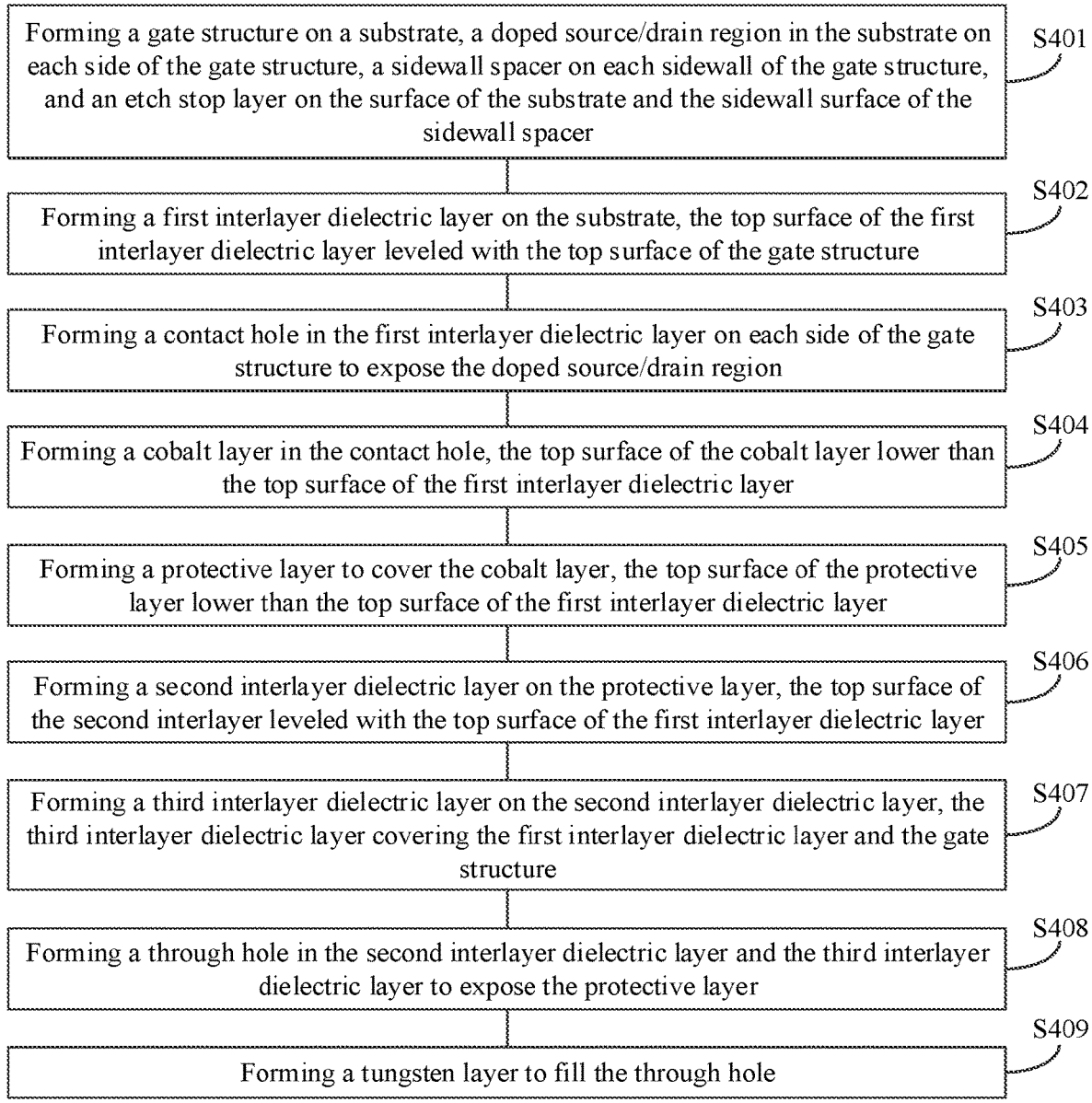
FIG. 13 illustrates a flowchart of an exemplary method for fabricating a semiconductor device consistent with some embodiments of the present disclosure.

FIG. 13 illustrates a flowchart of an exemplary method for fabricating a semiconductor device consistent with some embodiments of the present disclosure, and FIGS. 1-11 illustrate schematic cross-sectional views of semiconductor structures at certain stages of the exemplary method.

Figure 1:
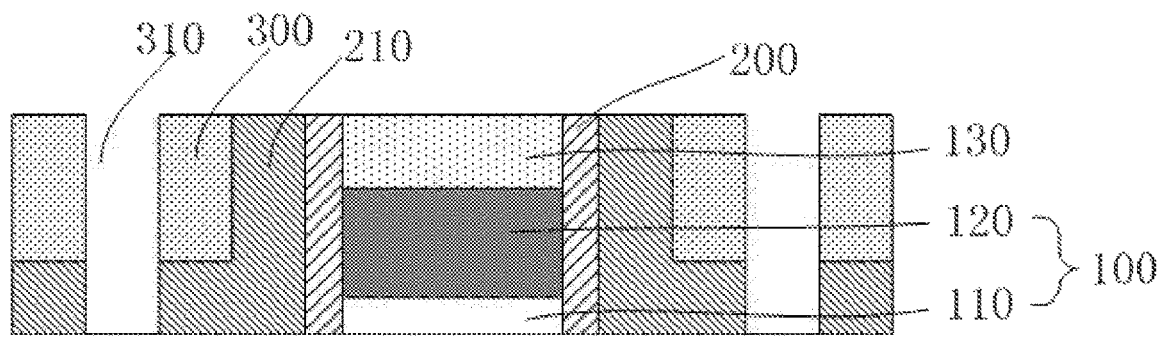
FIGS. 1-11 illustrate schematic cross-sectional views of semiconductor structures at certain stages of an exemplary method for fabricating a semiconductor device consistent with various embodiments of the present disclosure.

Referring to FIG. 13, a gate structure may be formed on a substrate, a doped source/drain region may be formed in the substrate on each side of the gate structure, a sidewall spacer may be formed on each sidewall of the gate structure, and an etch stop layer may be formed on the surface of the substrate and the sidewall surface of the sidewall spacer (S401). FIG. 1 illustrates a schematic cross-sectional view of a semiconductor structure consistent with various embodiments of the present disclosure.

Referring to FIG. 1, a substrate (not shown) may be provided, and a gate structure 100 may be formed on the substrate. In addition, a doped source/drain region (not shown) may be formed in the substrate on each side of the gate structure 100.

In one embodiment, the substrate may be made of silicon. In other embodiments, the substrate may be made of germanium, silicon germanium (SiGe), silicon carbide (SiC), gallium arsenide (GaAs), indium arsenide (InAs), or any other appropriate semiconductor material or composite structure.

In one embodiment, the gate structure 100 may be a metal gate structure. Accordingly, the gate structure 100 may include a work function layer 110 and a metal layer 120 disposed on the work function layer 110. Further, in one embodiment, a gate protective layer 130 may be disposed on the top of the gate structure 100.

It should be noted that after the substrate is provided, the method may also include forming a sidewall spacer 200 on each sidewall of the gate structure 100; and after forming the sidewall spacer 200, forming a doped source/drain region (not shown) in the substrate on each side of the gate structure 100. The doped source/drain region may be used as the source/drain region of the semiconductor device.

It should also be noted that, in one embodiment, an etch stop layer 210 may be formed on the sidewall of the sidewall spacer 200 and also on a portion of the surface of the substrate, and during a subsequently-performed etching process for forming contact holes, the top surface of the etch stop layer 210 may be used to define a stop position for the etching process, thereby avoiding the under-etching or over-etching problem.

Further, returning to FIG. 13, a first interlayer dielectric layer may be formed on the substrate, the top surface of the first interlayer dielectric layer leveled with the top surface of the gate structure (S402). The semiconductor structure shown in FIG. 1 includes an exemplary first interlayer dielectric layer formed on the substrate.

Referring to FIG. 1, in one embodiment, after forming the etch stop layer 210, a first interlayer dielectric layer 300 may be formed on the substrate. The top surface of the first interlayer dielectric layer 300 may be leveled with the top surface of the gate structure 100. In some embodiments, because a gate protective layer 130 is formed on the top of the gate structure 100, the top surface of the first interlayer dielectric layer may be leveled with the top surface of the gate protective layer 130.

The first interlayer dielectric layer 300 may be made of an insulting dielectric material. In one embodiment, the first interlayer dielectric layer 300 may be made of a material containing silicon oxyfluoride. In other embodiments, the first interlayer dielectric layer may be made of boron-containing silicon oxide or phosphor-containing silicon oxide.

Further, returning to FIG. 13, a contact hole may be formed in the first interlayer dielectric layer on each side of the gate structure to expose the doped source/drain region and the substrate in the doped source/drain region (S403). The semiconductor structure shown in FIG. 1 includes an exemplary contact hole formed through the first interlayer dielectric layer on each side of the gate structure.

Referring to FIG. 1, a contact hole 310 may be formed in the first interlayer dielectric layer 300 on each side of the gate structure 100. The contact hole 310 may expose the substrate in the corresponding doped source/drain region. In one embodiment, a dry etching process may be performed to remove a portion of the first interlayer dielectric layer 300 and the etch stop layer 210 on each side of the gate structure 100 such that the contact hole 310 may be formed.

Figure 2:
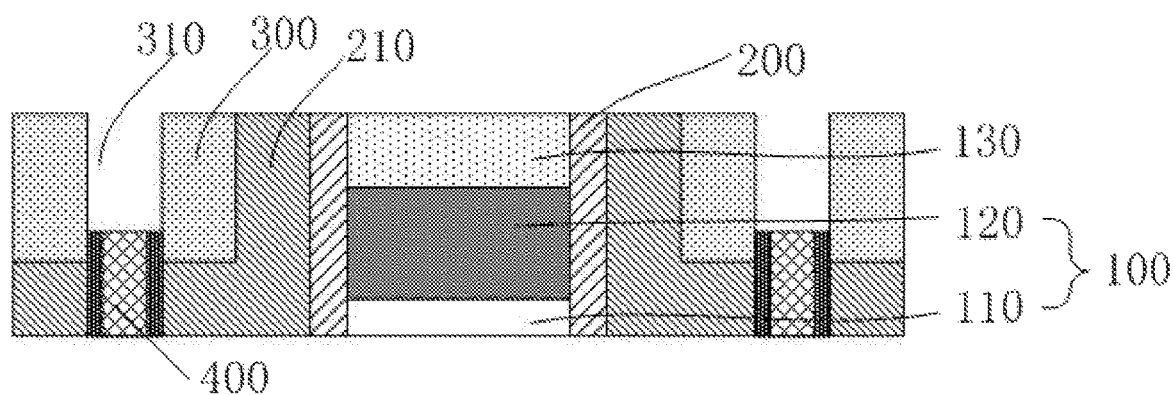

Further, returning to FIG. 13, a cobalt layer may be formed in the contact hole, and the top surface of the cobalt layer may be lower than the top surface of the first interlayer dielectric layer (S404). FIG. 2 illustrates a schematic cross-sectional view of a semiconductor structure consistent with various embodiments of the present disclosure.

Referring to FIG. 2, a cobalt layer 400 may be formed on the sidewall surface of the contact hole 310. The top surface of the cobalt layer 400 may be lower than the top surface of the first interlayer dielectric layer.

Figure 3:
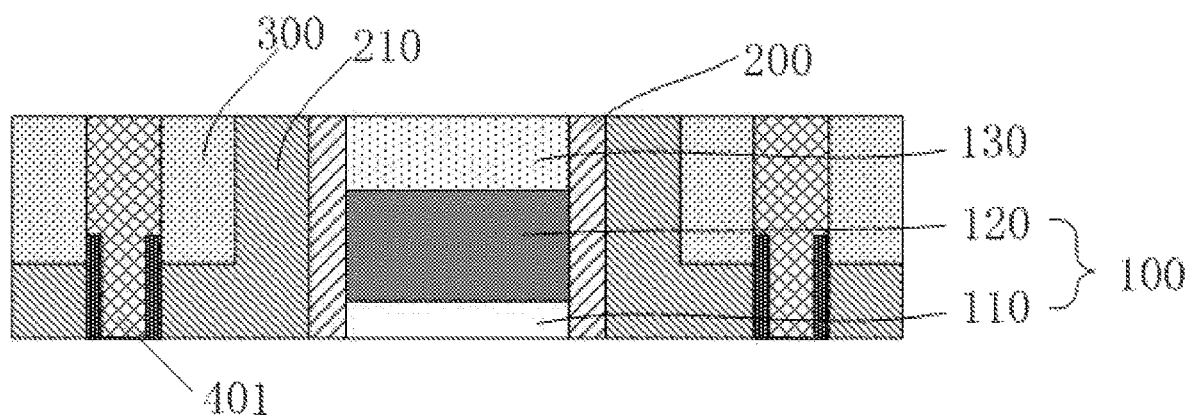

In one embodiment, the process of forming the cobalt layer 400 in the contact hole 310 may include the following exemplary steps. An initial cobalt layer may be formed to fill the contact hole 310 and also cover the top surface of the first interlayer dielectric layer 300. FIG. 3 illustrates a schematic cross-sectional view of a semiconductor structure consistent with various embodiments of the present disclosure. Referring to FIG. 3, an initial cobalt layer 401 may be formed to fill the contact hole 310. The initial cobalt layer 401 and also cover the top surface of the first interlayer dielectric layer 300. Further, the initial cobalt layer 401 may be planarized to remove the portion of the initial cobalt layer 401 formed on the first interlayer dielectric layer 300. After removing the portion of the initial cobalt layer 401 formed on the first interlayer dielectric layer 300, the top surface of the remaining portion of the initial cobalt layer 401 may be leveled with the top surface of the first interlayer dielectric layer 300. Further, the remaining portion of the initial cobalt layer 401 may be partially removed through an etching process to form the cobalt layer 400 in the contact hole 310. As such, the top surface of the formed cobalt layer 400 may be lower than the top surface of the first interlayer dielectric layer 300.

In one embodiment, a chemical vapor deposition (CVD) process may be performed to form the cobalt layer 400 in the contact hole 310. In other embodiments, the cobalt layer may be formed through a chemical electroplating process, an atomic layer deposition (ALD) process, a physical vapor deposition (PVD) process, or any other appropriate film deposition process.

In one embodiment, a chemical mechanical planarization (CMP) process may be performed to planarize the initial cobalt layer 401. The process parameters adopted in the CMP process may include a planarization pressure in a range of approximately 1 psi to 5 psi, a rotation speed of the grinding head in a range of approximately 20 rpm to 100 rpm, a grinding fluid containing an anti-cobalt-corrosion agent, and a pH value of the grinding fluid in a range of approximately 6.0 to 9.0.

In one embodiment, to form the cobalt layer 400, the top portion of the initial cobalt layer 401 may be removed through a wet etching process, and the wet etching may use deionized water with a pH value in a range of approximately 6.0 to 9.0 as an etching fluid.

In other embodiments, to form the cobalt layer, the top portion of the initial cobalt layer may be removed through a dry etching process, and the etching gas used in the dry etching process may be a halide-containing gas, including HCl gas or HBr gas.

In one embodiment, after etching the initial cobalt layer 401 to form the cobalt layer 400, an alkaline cleaning solution with a pH value in a range of approximately 8.0 to 10.0 may be used to replace pure water and clean the cobalt layer 400. The alkaline cleaning solution may be NH$_4$OH. In other embodiments, because pure water may cause corrosion of cobalt, the alkaline cleaning solution may be a weak organic base such as quaternary ammonium base, amide, etc. Therefore, using an alkaline cleaning solution may be able to suppress the corrosion problem of the cobalt layer 400, and thus obtain a cobalt layer with a desired appearance.

It should be noted that prior to forming the cobalt layer 400 in the contact hole 310, the method may further include forming a blocking layer on the sidewall of the contact hole 310. The process of forming the blocking layer may include the following exemplary steps.

Figure 4:
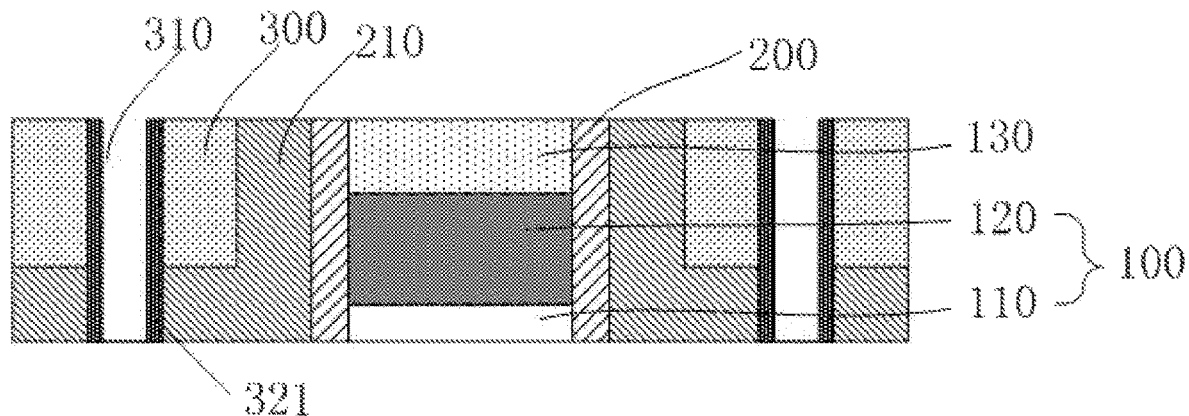

First, an initial blocking layer may be formed on the sidewall of the contact hole. FIG. 4 illustrates a schematic cross-sectional view of an exemplary semiconductor structure consistent with various embodiment of the present disclosure. Referring to FIG. 4, prior to forming the cobalt layer 400 in the contact hole 310, an initial blocking layer 321 may be formed on the sidewall of the contact hole 310. In one embodiment, the thickness of the initial blocking layer 321 formed on the sidewall of the contact hole 310 may be in a range of approximately 10 Å to 80 Å.

Figure 5:
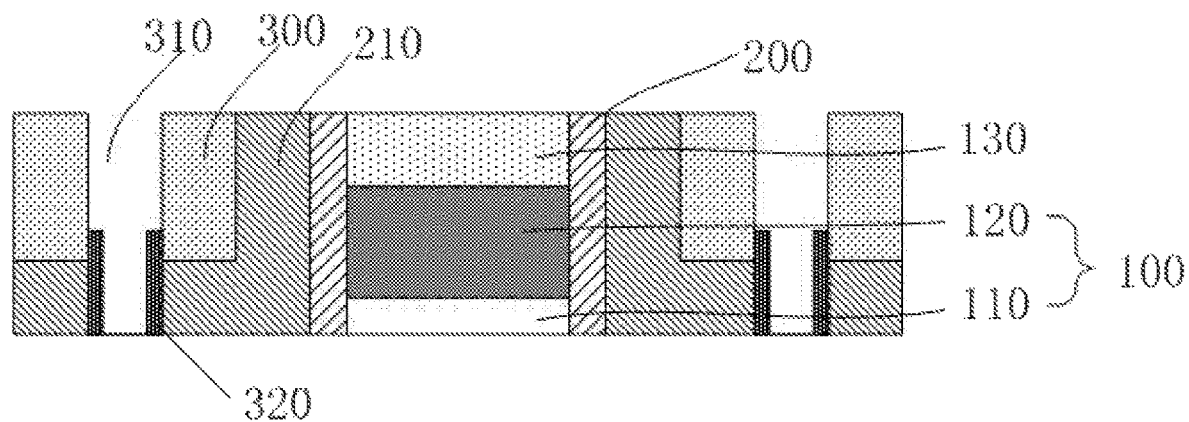

Further, after forming the initial blocking layer 321, the initial blocking layer 321 may be etched back such that the dimension of the initial blocking layer 321 in the direction perpendicular to the substrate may be reduced. FIG. 5 illustrates a schematic cross-sectional view of an exemplary semiconductor structure consistent with various embodiment of the present disclosure.

Referring to FIG. 5, after forming the initial blocking layer 321 (referring to FIG. 4), the initial blocking layer 321 may be etched back, such that the dimension of the initial blocking layer 321 in the direction perpendicular to the substrate may be reduced, and thus form a blocking layer 320. In one embodiment, the dimension of the blocking layer 320 in the direction perpendicular to the substrate may be the height of the blocking layer 320, and after etching back the initial blocking layer 321, the height of the formed blocking layer 320 may be in a range of approximately 200 Å to 400 Å. The top surface of the blocking layer 320 may be lower than the top surface of the first interlayer dielectric layer 300. In addition, the thickness of the blocking layer 320 in a direction perpendicular to the sidewall of the contact hole 310 may be in a range of approximately 10 Å to 80 Å.

In one embodiment, the blocking layer 320 may be able to prevent cobalt atoms in the cobalt layer 400 from diffusing into the surrounding dielectric layer, thereby preventing the performance of the semiconductor device from being destroyed due to the diffusion of cobalt. The blocking layer 320 may be made of TiN, TaN, Ta or Ti.

In one embodiment, the blocking layer 320 may be formed using a CVD method. In other embodiments, the blocking layer may be formed through a PVD process, an ALD process, or any appropriate thin-film deposition process.

In one embodiment, the blocking layer 320 may be etched back through a wet etching process. In other embodiments, the blocking layer 320 may be etched back though a dry etching process.

In one embodiment, etching the blocking layer 320 prior to forming the cobalt layer 400 may have the following reasons. By reducing the height of the blocking layer 320, the portion of the sidewall surface of the contact hole 310 may not be covered by the blocking layer 320, thereby providing a large space for the subsequent deposition of the initial cobalt layer 401 (referring to FIG. 3), and facilitating the formation of the cobalt layer 400. As such, the difficulty of the process of depositing the initial cobalt layer 401 may be reduced, and the obtained cobalt layer 400 may have desired morphology. In addition, etching the blocking layer 320 after the deposition of the cobalt layer 400 may cause damages to the cobalt layer 400, and thus affect the performance of the semiconductor device. Therefore, etching the blocking layer 320 in advance may be able to prevent the cobalt layer 400 from being damaged, thereby improving the performance of the semiconductor device.

It should be noted that, because the blocking layer 320 is used to prevent the cobalt atoms in the cobalt layer 400 from diffusing, when performing a wet etching process to form the cobalt layer 400, the top surface of the formed cobalt layer 400 may be leveled with the top surface of the blocking layer 320.

Figure 6:
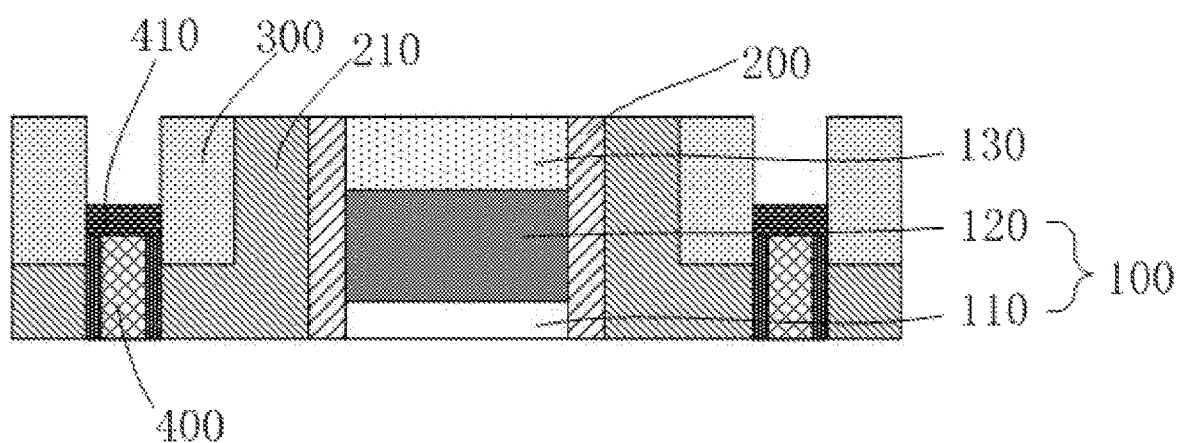

Further, returning to FIG. 13, a protective layer may be formed to cover the top surface of the cobalt layer with a top surface lower than the top surface of the first interlayer dielectric layer (S405). FIG. 6 illustrates a schematic cross-sectional view of an exemplary semiconductor structure consistent with various embodiment of the present disclosure.

Referring to FIG. 6, a protective layer 410 may be formed on the cobalt layer 400. The protective layer 410 may cover the top surface of the cobalt layer 400. The top surface of the protective layer 410 may be lower than the top surface of the first interlayer dielectric layer 300. In one embodiment, when a blocking layer 320 is formed between the cobalt layer 400 and the sidewall surface of the contact hole 310, the protective layer 410 may also cover the top surface of the blocking layer 320.

In one embodiment, the protective layer 410 may be used to provide protection for the cobalt layer 400. During the fabrication of semiconductor interconnect structures, tungsten is the material usually used to form the connections between metal layers. When depositing a tungsten layer on the cobalt layer, the WF$_4$ gas used for forming the tungsten layer may cause corrosion of cobalt. Therefore, the protective layer 400 disposed on the cobalt layer 400 may be able to prevent the cobalt layer 400 from being damaged when depositing tungsten in a subsequent process.

In one embodiment, the protective layer 410 may be made of TiN. In other embodiments, the protective layer may be made of TaN, Ta, Ti, or any other appropriate material.

It should be noted that to form the protective layer 410 with a top surface lower than the top surface of the first interlayer dielectric layer 300, the method may include the following exemplary steps.

Figure 7:
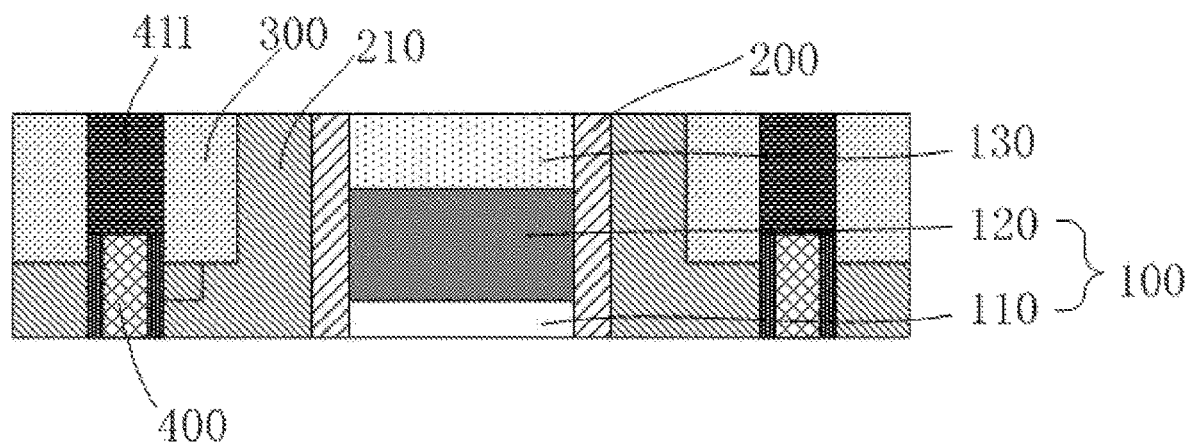

First, an initial protective layer may be formed on the cobalt layer and may fill up the contact hole. FIG. 7 illustrates a schematic cross-sectional view of a semiconductor structure consistent with various embodiments of the present disclosure. Referring to FIG. 7, an initial protective layer 411 may be formed on the cobalt layer 400 and may fill the contact hole 310 (referring to FIG. 2). The initial protective layer 411 may have a top surface leveled with the top surface of the first interlayer dielectric layer 300. Further, referring to FIG. 6, the initial protective layer 411 (referring to FIG. 7) may be etched back to form the protective layer 410. The protective layer 410 may have a top surface lower than the top surface of the first interlayer dielectric layer 300. In one embodiment, the thickness of the protective layer 410 may be in a range of approximately 50 Å to 150 Å.

In one embodiment, making the top surface of the protective layer 410 lower than the top surface of the first interlayer dielectric layer may allow a dielectric layer to be deposited into the contact hole 310 in a subsequent process, thereby preventing the cobalt layer 400 from shorting during subsequent fabrication processes.

In one embodiment, the initial protective layer 411 may be deposited through a CVD process. In other embodiments, the initial protective layer may be deposited through a PVD process, an ALD process, or any other appropriate deposition process.

In one embodiment, the initial protective layer 411 may be etched back through a wet etching process. In other embodiments, the initial protective layer may be etched back through a dry etching process.

Figure 8:
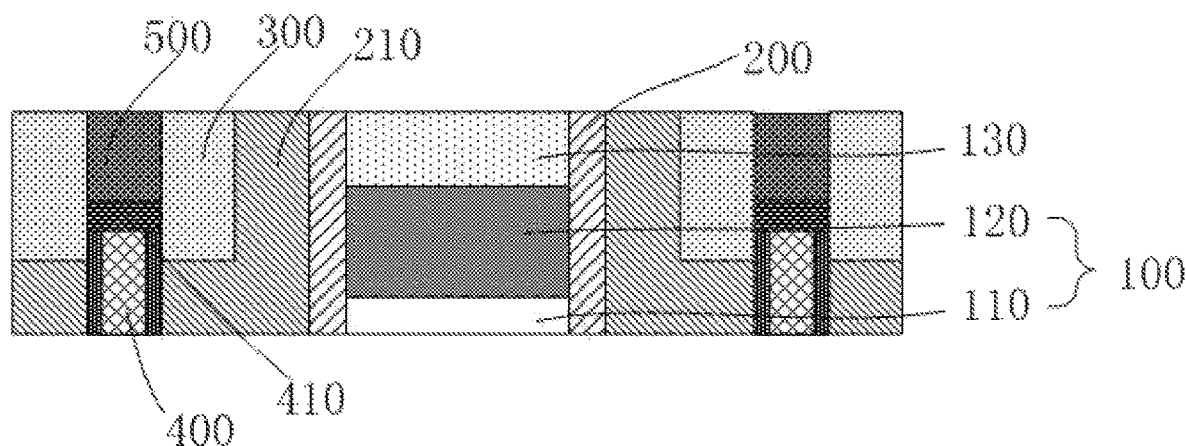

Further, returning to FIG. 13, a second interlayer dielectric layer may be formed on the protective layer, and the top surface of the second interlayer dielectric layer may be leveled with the top surface of the first interlayer dielectric layer (S406). FIG. 8 illustrates a schematic cross-sectional view of a semiconductor structure consistent with various embodiments of the present disclosure.

Referring to FIG. 8, a second interlayer dielectric layer 500 may be formed on the protective layer 410. The second interlayer dielectric layer 500 may be made of a material including one or more of $Si_3N_4$, SiON, SiOC, and SiC. In one embodiment, the second interlayer dielectric layer 500 may be made of SiON.

In one embodiment, the second interlayer dielectric layer 500 may be formed through a CVD process. In other embodiments, the second interlayer dielectric layer may be formed through a PVD process, an ALD process, or any other appropriate deposition process.

In one embodiment, when forming the second interlayer dielectric layer 500, the second interlayer dielectric layer 500 may be initially formed to not only fill the contact hole, but also cover the top surface of the first interlayer dielectric layer 300. Accordingly, the second interlayer dielectric layer 500 may be planarized to remove the portion of the second interlayer dielectric layer 500 formed above the first interlayer dielectric layer 300, such that the top surface of the remaining portion of the second interlayer dielectric layer 500 may be leveled with the top surface of the first interlayer dielectric layer 300.

In one embodiment, a CMP process may be performed to planarize the second interlayer dielectric layer 500. The process parameters adopted in the CMP process may include a planarization pressure in a range of approximately 1 psi to 5 psi, a rotation speed of the grinding head in a range of approximately 20 rpm to 100 rpm, abrasive particles of silica ($SiO_2$) or ceria ($CeO_2$), and a size of the abrasive particles in the grinding fluid in a range of approximately 20 nm to 150 nm.

Figure 9:
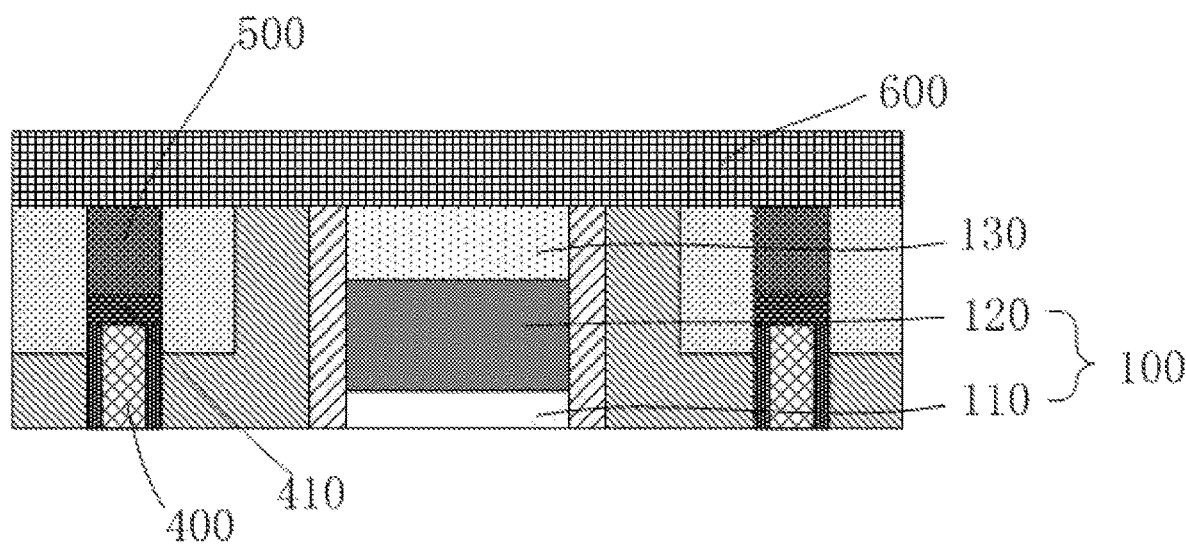

Further, returning to FIG. 13, a third interlayer dielectric layer may be formed on the second interlayer dielectric layer, the third interlayer dielectric layer covering the first interlayer dielectric layer and the gate structure (S407). FIG. 9 illustrates a schematic cross-sectional view of a semiconductor structure consistent with various embodiments of the present disclosure.

Referring to FIG. 9, a third interlayer dielectric layer 600 may be formed on the second interlayer dielectric layer 500.

The third interlayer dielectric layer 600 may cover the first interlayer dielectric layer 300 and the top surface of the gate structure 100.

In one embodiment, the third interlayer dielectric layer 600 may be made of an oxide, that is, the third interlayer dielectric layer 600 may be an oxide layer. The third interlayer dielectric layer 600 may be formed through a CVD process.

Figure 10:
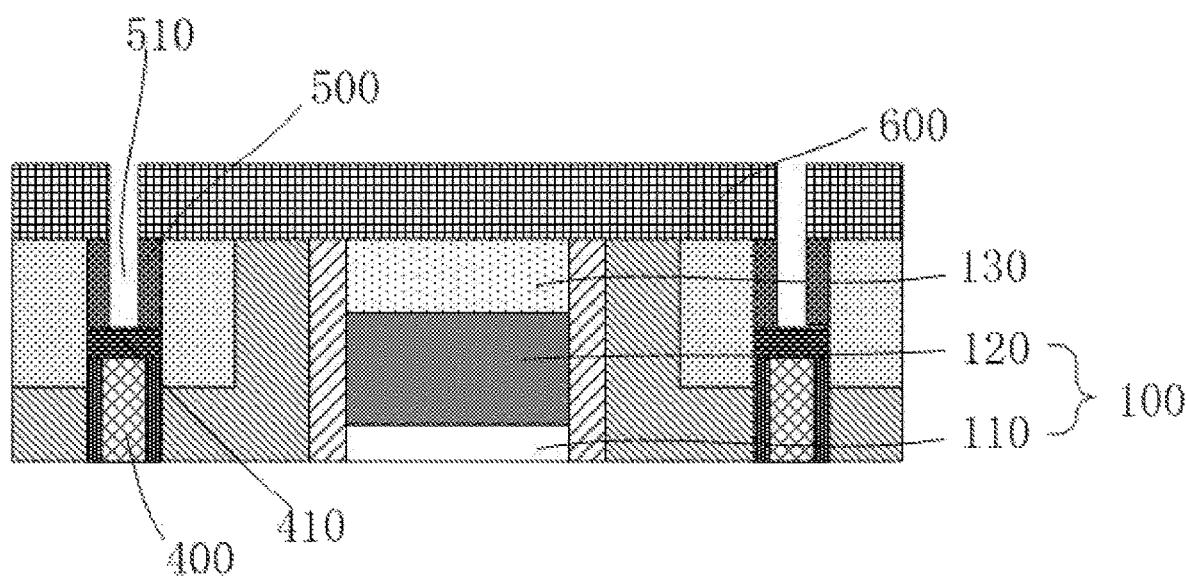

Further, returning to FIG. 13, a through hole may be formed in the second interlayer dielectric layer and the third interlayer dielectric layer to expose the protective layer (S408). FIG. 10 illustrates a schematic cross-sectional view of a semiconductor structure consistent with various embodiments of the present disclosure.

Referring to FIG. 10, a through hole 510 may be formed in the second interlayer dielectric layer 500 and the third interlayer dielectric layer 600. The through hole 510 may expose the protective layer 410.

In one embodiment, a dry etching process may be performed on the second interlayer dielectric layer 500 and the third interlayer dielectric layer 600, such that a portion of the second interlayer dielectric layer 500 and the third interlayer dielectric layer 600 may be removed to form the through hole 510.

In one embodiment, the third interlayer dielectric layer 600 may be made of a material different from the material used for forming the second interlayer dielectric layer 500, such that when performing the etching process to form the through hole 510, the third interlayer dielectric layer 600 may also serve as an etch stop layer, thereby avoiding the under-etching or over-etching problem.

Figure 11:
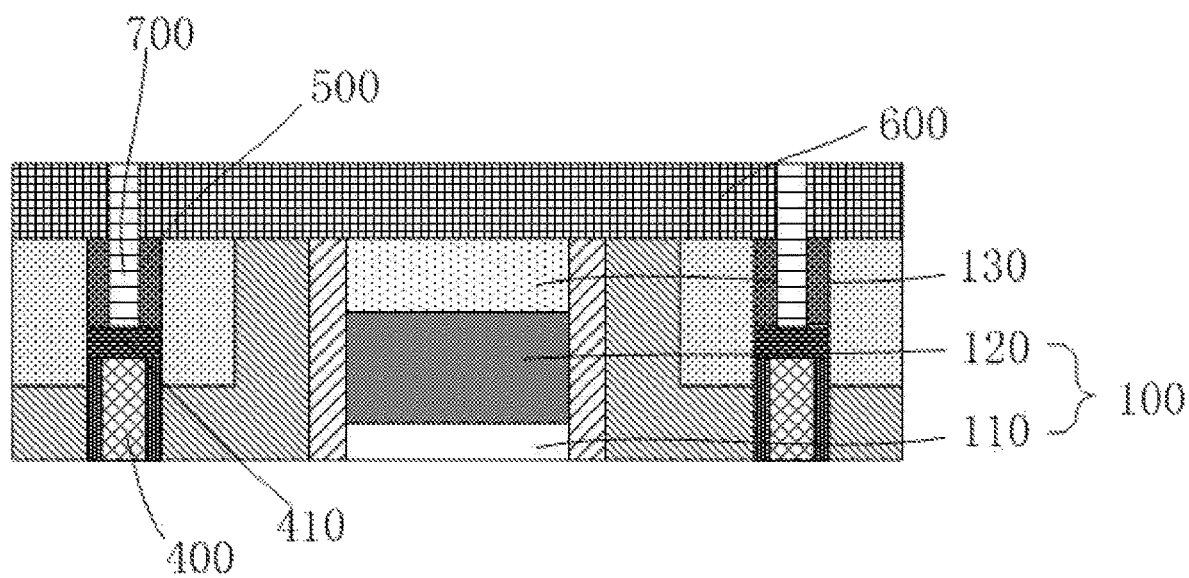

Further, returning to FIG. 13, a tungsten layer may be formed to fill the through hole (S409). FIG. 11 illustrates a schematic cross-sectional view of a semiconductor structure consistent with various embodiments of the present disclosure.

Referring to FIG. 11, a tungsten layer 700 may be formed in the through hole 510. The tungsten layer 700 may be connected to the cobalt layer 400, and thus further connected to the doped source/drain region formed in the substrate through the cobalt layer 400.

In one embodiment, the tungsten layer 700 may be formed through a CVD process. In other embodiments, the tungsten layer may be formed through a deposition process including one or more of CVD, PVD, and ALD. Alternatively, the tungsten layer may be formed through a multi-step deposition process.

It should be noted that in semiconductor interconnect structures, in addition to being connected to the doped source/drain region, the tungsten layer 700 may also need to be connected to the gate structure 100. Accordingly, a through hole (not shown) may also be formed through the third interlayer dielectric layer 600 to expose the gate structure 100, and then a metal layer may be filled into the through hole above the gate structure to form an interconnect structure. Moreover, in a subsequent process, the third interlayer dielectric layer 600 may be removed.

Figure 12:
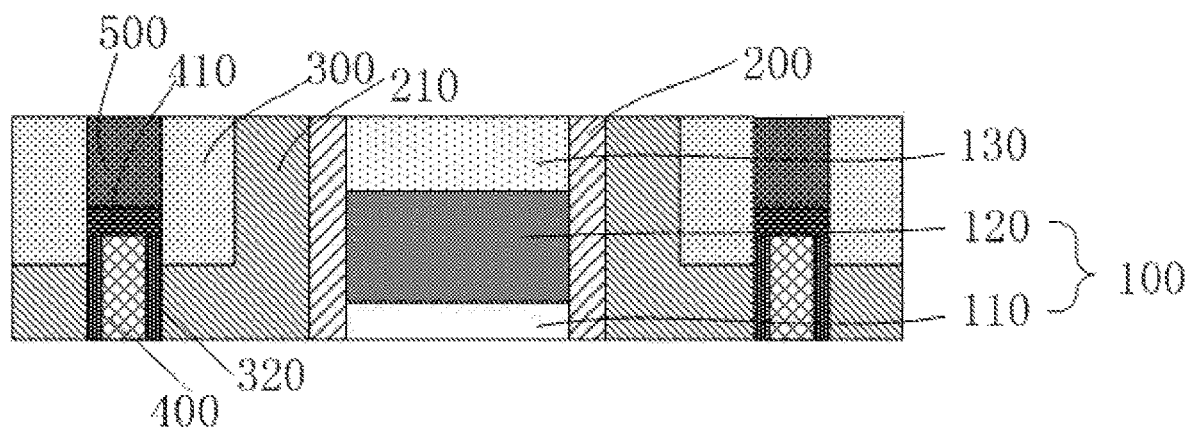
FIG. 12 illustrates a schematic cross-sectional view of an exemplary semiconductor device consistent with various embodiments of the present disclosure.

The present disclosure also provides a semiconductor device. FIG. 12 illustrates a schematic cross-sectional view of an exemplary semiconductor device consistent with various embodiments of the present disclosure.

Referring to FIG. 12, the semiconductor device may include a substrate (not shown); a gate structure 100, disposed on the substrate; a doped source/drain region, formed in the substrate on each side of the gate structure 100; a first interlayer dielectric layer 300, formed on the substrate and having a top surface leveled with the top surface of the gate structure 100; a cobalt layer 400, formed in the first interlayer dielectric layer 300, having a top surface lower than the top surface of the first interlayer dielectric layer 300, and connected to the substrate; a protective layer 410, covering the cobalt layer 400 and having a top surface lower than the top surface of the first interlayer dielectric layer 300.

In one embodiment, the gate structure 100 may be a metal gate structure. Accordingly, the gate structure 100 may include a work function layer 110 and a metal layer 120 disposed on the work function layer 110. In one embodiment, the semiconductor device may further include a gate protective layer 130, formed on the top of the gate structure 100.

In one embodiment, the protective layer 410 may be made of TiN. In other embodiments, the protective layer may be made of TaN, Ta, Ti, or any other appropriate material.

It should be noted that the semiconductor device may further include a sidewall spacer 200, formed on each sidewall of the gate structure 100; and an etch stop layer 210, formed on the sidewall of the sidewall spacer 200 and also covering a portion of the surface of the substrate.

In one embodiment, the semiconductor device may further include a blocking layer 320, formed between the cobalt layer 400 and the first interlayer dielectric layer 300 to prevent cobalt ions in the cobalt layer 400 from diffusing into the first interlayer dielectric layer 300. The blocking layer 320 may cover the sidewall of the cobalt layer 400 and may be in contact with the substrate. When the etch stop layer 210 is formed on the surface of the substrate, the blocking layer 320 may also be formed between the cobalt layer 400 and the etch stop layer 210. In one embodiment, the blocking layer 320 may be made of TiN. In other embodiments, the blocking layer 320 may be made of TiC.

In one embodiment, the semiconductor structure may further include a second interlayer dielectric layer 500, formed on the protective layer 410 and having a top surface leveled with the top surface of the first interlayer dielectric layer 300.

According to the disclosed semiconductor device, a protective layer 410 is formed on the cobalt layer 400 to prevent the $WF_4$ gas used in a subsequent tungsten deposition process from causing corrosion of cobalt, such that the cobalt layer 400 may be able to have a desired morphology. Therefore, the performance of the semiconductor device may be improved.

Compared to existing semiconductor devices and fabrication methods, the disclosed semiconductor device and fabrication method may demonstrate the following exemplary advantages.

According to the disclosed method and semiconductor device, a protective layer is formed on the cobalt layer. The protective layer provides protection for the cobalt layer. When forming a tungsten layer on the cobalt layer in a subsequent process, the protective layer prevents the $WF_4$ gas used for forming the tungsten layer from causing corrosion of cobalt, thereby suppressing the corrosion problem of the cobalt layer. As such, the quality and the performance of the interconnect structures formed by the cobalt layer may be improved, and thus the electrical performance of the semiconductor device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor device, comprising:
   forming a gate structure on a substrate, and forming a doped source/drain region in the substrate and on each side of the gate structure;
   forming a first interlayer dielectric layer, a top surface of the first interlayer dielectric layer leveled with a top surface of the gate structure;
   forming a contact hole in the first interlayer dielectric layer on each side of the gate structure to expose the doped source/drain region and the substrate in the doped source/drain region;
   forming a cobalt layer in the contact hole, a top surface of the cobalt layer lower than the top surface of the first interlayer dielectric layer;
   forming a protective layer to cover the cobalt layer, a top layer of the protective layer lower than the top surface of the first interlayer dielectric layer; and
   forming a second interlayer dielectric layer on the protective layer, a top surface of the second interlayer dielectric layer leveled with the top surface of the first interlayer dielectric layer.

2. The method according to claim 1, wherein forming the protective layer to cover the cobalt layer includes:
   forming an initial protective layer on the cobalt layer, a top surface of the initial protective layer leveled with the top surface of the first interlayer dielectric layer; and
   removing a top portion of the initial protective layer by etching back the initial protective layer, wherein a remaining portion of the initial protective layer forms the protective layer.

3. The method according to claim 2, wherein:
   a process of forming the initial protective layer on the cobalt layer includes one of chemical vapor deposition (CVD), physical vapor deposition (PVD), and atomic layer deposition (ALD).

4. The method according to claim 1, wherein:
   the protective layer is made of TiN, TaN, Ta, or Ti; and
   a thickness of the protective layer is in a range of approximately 50 Å to 150 Å.

5. The method according to claim 1, further including:
   forming a third interlayer dielectric layer on the second interlayer dielectric layer;
   forming a through hole in the second interlayer dielectric layer and the third interlayer dielectric layer to expose the protective layer; and
   forming a tungsten layer to fill the through hole.

6. The method according to claim 5, wherein:
   the second interlayer dielectric layer is made of a material including one or more of $Si_3N_4$, SiON, SiOC, and SiC.

7. The method according to claim 5, wherein:
   the third interlayer dielectric layer is made of an oxide.

8. The method according to claim 1, prior to forming the cobalt layer in the contact hole, further including:
   forming an initial blocking layer on a sidewall surface of the contact hole, a top surface of the initial blocking layer leveled with the top surface of the first interlayer dielectric layer; and
   etching back the initial blocking layer to form a blocking layer, a top surface of the blocking layer lower than the top surface of the first interlayer dielectric layer.

9. The method according to claim 8, wherein forming the cobalt layer in the contact hole includes:
- forming an initial cobalt layer in the contact hole, wherein the initial cobalt layer covers the top surface of the first interlayer dielectric layer;
- planarizing the initial cobalt layer to remove a portion of the initial cobalt layer formed above the top surface of the first interlayer dielectric layer; and
- etching a remaining portion of the initial cobalt layer to form the cobalt layer, wherein the top surface of the cobalt layer is leveled with the top surface of the blocking layer.

10. The method according to claim 9, wherein:
a process of forming the initial cobalt layer includes one of CVD, PVD, and ALD.

11. The method according to claim 9, wherein:
- a thickness of the blocking layer in a direction perpendicular to the sidewall of the contact hole is in a range of approximately 10 Å to 80 Å; and
- a height of the blocking layer and the cobalt layer, in a direction perpendicular to the substrate, is in a range of approximately 200 Å to 400 Å.

12. The method according to claim 9, wherein:
- a process of planarizing the initial cobalt layer is a chemical mechanical planarization (CMP) process; and
- process parameters adopted in the CMP process include a planarization pressure in a range of approximately 1 psi to 5 psi, a rotation speed of a grinding head in a range of approximately 20 rpm to 100 rpm, and a pH value of a grinding fluid in a range of approximately 6.0 to 9.0.

13. The method according to claim 9, wherein:
a process of etching the remaining portion of the initial cobalt layer to form the cobalt layer is a wet etching process using deionized water with a pH value in a range of approximately 6 to 9 as an etching fluid.

14. The method according to claim 9, wherein:
a process of etching the remaining portion of the initial cobalt layer to form the cobalt layer is a wet etching process using a halide-containing gas, including HCl gas or HBr gas, as an etching gas.

15. The method according to claim 8, wherein:
the blocking layer is made of TiN or TiC.

* * * * *